United States Patent
Fujii et al.

(10) Patent No.: US 8,174,282 B2
(45) Date of Patent: May 8, 2012

(54) LEAK CURRENT DETECTION CIRCUIT, BODY BIAS CONTROL CIRCUIT, SEMICONDUCTOR DEVICE, AND SEMICONDUCTOR DEVICE TESTING METHOD

(75) Inventors: Kiyonaga Fujii, Kasugai (JP); Yasushige Ogawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/576,670

(22) Filed: Oct. 9, 2009

(65) Prior Publication Data
US 2010/0026335 A1    Feb. 4, 2010

Related U.S. Application Data

(63) Continuation of application No. PCT/JP2007/057919, filed on Apr. 10, 2007.

(51) Int. Cl.
*G01R 31/02* (2006.01)
*G01R 31/28* (2006.01)

(52) U.S. Cl. ........... 324/762.01; 324/750.3; 324/762.02; 324/762.09; 257/48; 327/534

(58) Field of Classification Search .......... 324/754–765, 324/750.3–757.05, 762.01, 762.1; 257/48; 327/534–537
See application file for complete search history.

(56) References Cited

U.S. PATENT DOCUMENTS

| | | | |
|---|---|---|---|
| 6,605,981 B2 | 8/2003 | Bryant et al. | |
| 6,806,726 B2 * | 10/2004 | Okada et al. | 324/762.09 |
| 6,882,172 B1 | 4/2005 | Suzuki et al. | |
| 6,885,210 B1 | 4/2005 | Suzuki | |
| 7,138,851 B2 | 11/2006 | Sumita et al. | |
| 7,235,997 B2 * | 6/2007 | Huang | 324/762.09 |
| 7,358,793 B2 | 4/2008 | Sumita et al. | |
| 7,701,280 B2 * | 4/2010 | Sumita | 327/534 |
| 7,705,656 B2 * | 4/2010 | Jung | 327/427 |
| 7,714,601 B2 * | 5/2010 | Ito | 324/763 |
| 7,994,842 B2 * | 8/2011 | Ito | 327/534 |
| 2006/0076970 A1 * | 4/2006 | Furukawa | 324/765 |
| 2006/0091936 A1 * | 5/2006 | Ikenaga et al. | 327/534 |
| 2006/0186946 A1 * | 8/2006 | Hughes | 327/427 |
| 2007/0045744 A1 | 3/2007 | Ito | |

FOREIGN PATENT DOCUMENTS

| | | |
|---|---|---|
| JP | 2003-008428 A | 1/2003 |
| JP | 2004-165649 A | 6/2004 |
| JP | 2006-112837 A | 4/2006 |
| JP | 2007-036711 A | 2/2007 |

\* cited by examiner

*Primary Examiner* — Roberto Velez
*Assistant Examiner* — Emily Chan
(74) *Attorney, Agent, or Firm* — Fujitsu Patent Center

(57) ABSTRACT

A leak current detection circuit that improves the accuracy for detecting a leak current in a MOS transistor without enlarging the circuit scale. The leak current detection circuit includes at least one P-channel MOS transistor which is coupled to a high potential power supply and which is normally inactivated and generates a first leak current, at least one N-channel MOS transistor which is coupled between a low potential power and at least the one P-channel MOS transistor and which is normally inactivated and generates a second leak current, and a detector which detects a potential generated at a node between the at least one P-channel MOS transistor and the at least one N-channel MOS transistor in accordance with the first and second leak currents.

19 Claims, 6 Drawing Sheets

| Condition | Generated Control Signal (Operation) |
|---|---|
| Condition C1 ($V_x < V1$) | CP1 (VNW−VC1), CN1 (VPW−VC1) |
| Condition C2 ($V1 < V_x < VL$) | CP2 (VNW−VC2), CN2 (VPW−VC2) |
| Condition C3 ($VL < V_x < VH$) | End Testing Operation |
| Condition C4 ($VH < V_x < V2$) | CP3 (VNW+VC3), CN3 (VPW+VC3) |
| Condition C5 ($V2 < V_x$) | CP4 (VNW+VC4), CN4 (VPW+VC4) |

LEAK CURRENT DETECTION CIRCUIT, BODY BIAS CONTROL CIRCUIT, SEMICONDUCTOR DEVICE, AND SEMICONDUCTOR DEVICE TESTING METHOD

FIELD

The present invention relates to a leak current detection circuit, a body bias control circuit, semiconductor device, and a method for testing a semiconductor device.

Semiconductor devices capable of increasingly high operation speeds have been developed in recent years through miniaturization and high integration. However, the variability of element characteristics caused by variation in processes during the manufacturing of such semiconductor devices cannot be ignored. Since the variations of element characteristics influence logical operations, there are demands to reduce this influence.

BACKGROUND

The MOS transistors configuring the semiconductor device are subject to variations during the manufacturing process. This leads to variations in leak currents and threshold voltages. Thus, there are variations in the operation speeds of the MOS transistors. For example, there may be large variations in operation speeds between a P-channel MOS transistor (PMOS transistor) and an N-channel MOS transistor (NMOS transistor) that configures an inverter circuit. As a result, a problem arises in that logical operations cannot be performed normally. That is, when, for example, the operation speed of the PMOS transistor is slow and the operation speed of the NMOS transistor is fast, the rising waveform of the output pulse from the inverter circuit becomes slack, and the falling waveform of the output pulse becomes acutely peaked. Thus, a problem arises in that the H level pulse width of the output pulse becomes narrower than the desired width.

Methods have been proposed for detecting variations in the operation speeds of MOS transistors by controlling the body bias (substrate voltage) of each MOS transistor based on the leak current in each MOS transistor, which correlates to the operation speed (refer, for example, to patent documents 1 and 2).

FIG. 8 is a block diagram showing the leak current detection circuit used in patent document 1. The leak current detection circuit for detecting the leak current in an NMOS transistor is described below. As shown in FIG. 8, a ring oscillator 70 includes a leak unit 71, a precharger 72, an amplification circuit 73, a delay circuit 74, and an even number of inverters 75. The leak unit 71 is configured by an NMOS transistor QN10. A low potential power VSS is normally applied to the gate of the transistor QN10 to inactivate the transistor QN10. A leak current flows between the source and drain of the transistor QN10 while the transistor QN10 is inactivated. The precharger 72 is configured by a PMOS transistor QP10 which is of a conduction type that differs from the NMOS transistor QN10. The amplification circuit 73 is coupled at a node X10 between the transistors QN10 and QP10, and a potential V10 at the node X10 is supplied to the amplification circuit 73. The amplification circuit 73 provides an output signal, which corresponds to the comparison result of a standard voltage VR and the potential V10 of the node X10, to the gate of the transistor QP10 through the delay circuit 74.

When a low potential power VSS level signal is provided to the gate of the transistor QP10, the transistor QP10 is activated and a load accumulates in a capacitor (line capacitor) at the node X10. Thus, the potential V10 of the node X10 supplied to the amplification circuit 73 gradually increases to a high potential power VDD (refer to charging time t1), as shown in FIG. 9. At this time, when the potential V10 becomes a high voltage exceeding the standard voltage VR, an H level output signal is output from the amplification circuit 73. The high potential power VDD level signal, which corresponds to this H level output signal, is supplied to the gate of the transistor QP10, thus inactivating the transistor QP10. Then, the load accumulated in the capacitor of the node X10 is discharged via the leak current flowing between the source and the drain of the transistor QP10. In this way, the potential V10 at the node X10 is gradually decreased (refer to discharge time t2), as shown in FIG. 9. When the potential V10 becomes less than the standard voltage VR, the output signal from the amplification circuit 73 shifts from an H level to an L level. Then, the low potential power VSS level signal corresponding to this L level output signal is provided to the gate of the transistor QP10, and the transistor QP10 is activated. Thus, a load again accumulates in the capacitor of the node X10. In this way, the charging time t1 and discharging time t2 are repeated, as shown in FIG. 9.

The output signal of the amplification circuit 73, which shifts so that the signal level alternates between an H level and an L level, is input to a leak current calculator 80. At this time, the H level output signal provided to the leak current calculator 80 is converted to a frequency which corresponds to the leak current. The leak current calculator 80 counts the input frequency via a counter circuit and calculates the leak current. Then, the body bias of the NMOS transistors of the semiconductor device are controlled based on the leak current calculated in the leak current calculator 80.

However, the H level output signal (frequency) includes not only a component of the leak current of the transistor QP10 (discharging time t2 component of FIG. 9) but also a component of the transistor QP10 relating to the charge of the node X10 (charging time t1 component in FIG. 9). When the leak current of the transistor QP10 is sufficiently less than the ON current of the transistor QP10, the discharging time t2 becomes sufficiently longer than the charging time t1, as shown in FIG. 9. The effect of the charging time t1 component is therefore small. However, when the leak current of the transistor QN10 increases, the leak current discharging time t2 decreases, as shown in FIG. 10. The effect of the charging time t1 component is therefore increased. In the leak current detection circuit of patent document 1, a problem therefore arises inasmuch as the leak current cannot be accurately measured through the influence of the transistor QP10, which is separate from the detection target NP10.

In order to solve the problem of abnormal operation of the inverter circuits resulting from variations in element characteristics described above, it is necessary to control the body bias of each MOS transistor by comparing the leak current of the NMOS transistor with the leak current of the PMOS transistor. Accordingly, in order to compare the leak current of each MOS transistor in the configuration described in patent document 1, a comparator circuit must be provided to compare the count value of the counter circuit of both leak current detection circuits and the leak current detection circuit of the PMOS transistor in addition to the leak current detection circuit of the NMOS transistor shown in FIG. 8. In patent document 1, therefore, problems arise in that increased circuit complexity and scale are unavoidable in order to compare the leak current of each MOS transistor.

Patent Document 1: U.S. Pat. No. 6,885,210
Patent Document 2: U.S. Pat. No. 6,882,172

SUMMARY

The present invention provides a leak current detection circuit, body bias control circuit, semiconductor device, and method for testing the semiconductor device capable of improving the accuracy of detecting a leak current in a MOS transistor, while suppressing an increase in the scale of the circuit.

A first aspect of the present invention provides a leak current detection circuit. The leak current detection circuit includes at least one P-channel MOS transistor which is coupled to a high potential power supply and which is normally inactivated and generates a first leak current. At least one N-channel MOS transistor is coupled between a low potential power supply and the at least one P-channel MOS transistor and is normally inactivated and generates a second leak current. A detector detects a potential generated at a node between the at least one P-channel MOS transistor and the at least one N-channel MOS transistor in accordance with the first and second leak currents.

A second aspect of the present invention provides a leak current detection circuit. The leak current detection circuit includes a plurality of P-channel MOS transistors having different element characteristics, coupled to a high potential power supply, and including a first transistor which has a first element characteristic and which is normally inactivated and generates a first leak current, and a second transistor which has a second element characteristic that differs from the first element characteristic and which is normally inactivated and generates a second leak current. A plurality of N-channel MOS transistors having different element characteristics are coupled between a low potential power supply and the plurality of P-channel MOS transistors and include a third transistor which has the first element characteristic and which is normally inactivated and generates a third leak current. A fourth transistor has the second element characteristic and is normally inactivated and generates a fourth leak current. A detector which detects a potential generated at the node between the plurality of P-channel MOS transistors and the plurality of N-channel MOS transistors in accordance with the first, second, third, and fourth leak currents.

A third aspect of the present invention provides a body bias control circuit coupled to a leak current detection circuit. The leak current detection circuit includes a P-channel MOS transistor coupled to a high potential power supply, which is normally inactivated and generates a first leak current, an N-channel MOS transistor which is coupled between a low potential power supply and the P-channel MOS transistor and which is normally inactivated and generates a second leak current, and a detector which detects a potential in accordance with the first leak current and the second leak current at a node between the P-channel MOS transistor and the N-channel MOS transistor. The P-channel MOS transistor has a first backgate which receives a first body bias, and the N-channel MOS transistor has a second backgate which receives a second body bias. The body bias control circuit includes a control circuit which controls at least either one of the first body bias and the second body bias in accordance with the potential detected by the detector.

A fourth aspect of the present invention provides a semiconductor device that includes an internal circuit including a plurality of first P-channel MOS transistors, each having a first backgate, and a plurality of second N-channel MOS transistors, each having a second backgate. A testing circuit is coupled to the internal circuit and supplies the first backgate and the second backgate with a first body bias and a second body bias, respectively. The testing circuit includes a leak current detection circuit including a third P-channel MOS transistor which is coupled to a high potential power supply and which is normally inactivated and generates a first leak current, a fourth N-channel MOS transistor which is coupled between a low potential power supply and the third P-channel MOS transistor and which is normally inactivated and generates a second leak current, and a detector which detects a potential that is in accordance with the first leak current and the second leak current at a node between the third P-channel MOS transistor and the fourth N-channel MOS transistor. A body bias control circuit controls at least either one of the first body bias and the second body bias in accordance with the potential detected by the detector.

A fifth aspect of the present invention is a semiconductor device including an internal circuit including a plurality of first P-channel MOS transistors each having a first element characteristic and a first backgate, a plurality of second P-channel MOS transistors each having a second element characteristic and a second backgate, a plurality of third N-channel MOS transistors each having the first element characteristic and a third backgate, and a plurality of fourth N-channel MOS transistors each having the second element characteristic and a fourth backgate. A testing circuit is coupled to the internal circuit and supplies a first body bias to the first and second backgates and supplies a second body bias to the third and fourth backgates. The testing circuit includes a leak current detection circuit including an n number of fifth P-channel MOS transistors having the first element characteristic which are coupled to a high potential power supply, normally inactivated, and generate a first leak current; an n number of sixth P-channel MOS transistors having the second element characteristic which are coupled to the high potential power supply, normally inactivated, and generate a second leak current; an n number of seventh N-channel MOS transistors having the first element characteristic which are coupled between a low potential power supply and the fifth and sixth P-channel MOS transistors, normally inactivated, and generate a third leak current; an n number of eighth N-channel MOS transistors having the second element characteristic which are coupled between the low potential power supply and the fifth and sixth P-channel MOS transistors, normally inactivated, and generating a fourth leak current; and a detector which detects the potential corresponding to the first through fourth leak currents at a node between the fifth and sixth P-channel MOS transistors and the seventh and eighth N-channel MOS transistors. A body bias control circuit controls at least either one of the first body bias and the second body bias in accordance with the potential detected by the detector.

A sixth aspect of the present invention is a method for testing a semiconductor device. The semiconductor device is provided with an internal circuit including a plurality of first P-channel MOS transistors each having a first backgate and a plurality of second N-channel MOS transistors each having a second backgate. A testing circuit tests operation of the internal circuit by supplying the first backgate and the second backgate respectively with a first body bias and a second body bias. The testing circuit includes a third P-channel MOS transistor which is coupled to a high potential power supply and which is normally inactivated and generates a first leak current and a fourth N-channel MOS transistor which is coupled between a low potential power supply and the third P-channel MOS transistor and which is normally inactivated and generates a second leak current. The method includes detecting a potential that is in accordance with the first and second leak currents at a node between the third P-channel MOS transistor and the fourth N-channel MOS transistor, and changing at least either one of the first body bias and the second body bias in accordance with the detected potential.

DESCRIPTION OF EMBODIMENTS

Figure 1:
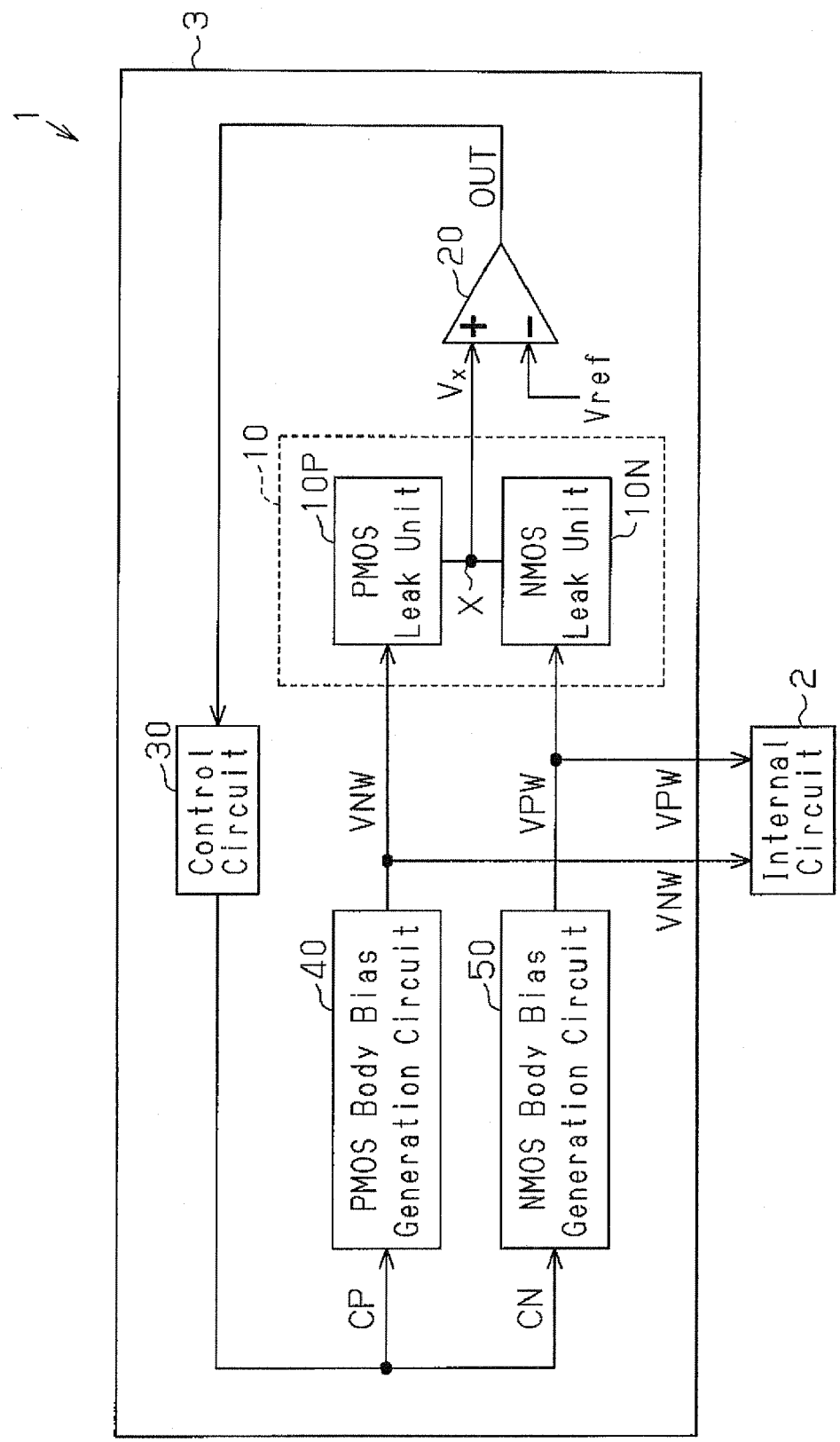
FIG. 1 is a block diagram showing the overall structure of a semiconductor device in a first embodiment of the present invention.

A semiconductor device 1 according to a first embodiment of the present invention will now be discussed with reference to FIGS. 1 through 4. FIG. 1 is a block diagram showing the overall structure of the semiconductor device 1, and FIG. 2 is a circuit diagram showing the internal structure of a detection circuit 10.

As shown in FIG. 1, the semiconductor device 1 is configured by an internal circuit 2 which includes a circuit for realizing a desired operation during normal operation of the semiconductor device, and a testing circuit 3 which operates during testing. The internal circuit 2 and the testing circuit 3 are formed on the same substrate. The testing circuit 3 is configured by a detection circuit 10, comparator 20, control circuit 30, PMOS body bias generation circuit 40, and NMOS body bias generation circuit 50. The detection circuit 10 and the comparator 20 configure the leak current detection circuit.

The detection circuit 10 includes a PMOS leak unit 10P and NMOS leak unit 10N, which are coupled in series. A node X between the PMOS leak unit 10P and the NMOS leak unit 10N is coupled to a non-inversion input terminal of the comparator 20.

Figure 2:
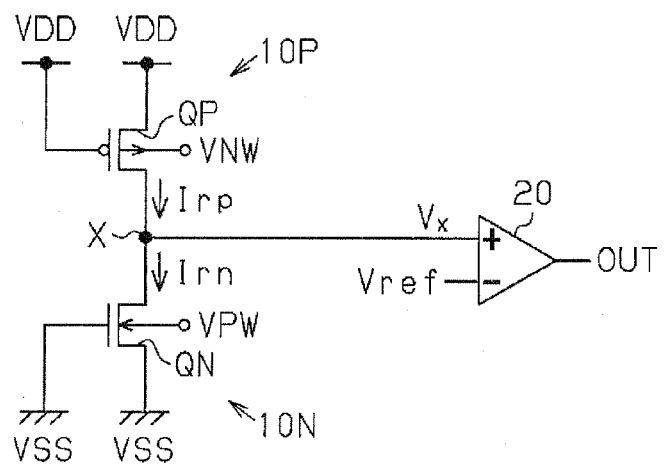
FIG. 2 is a circuit diagram showing the internal structure of the detection circuit of FIG. 1.

As shown in FIG. 2, the PMOS leak unit 10P is configured by a single PMOS transistor QP, and the NMOS leak unit 10N is configured by a single NMOS transistor QN. The transistor QP and the transistor QN are coupled in series between a high potential power VDD and a low potential power VSS. That is, the source of the transistor QP is coupled to the high potential power VDD, and the drain is coupled to the drain of the transistor QN. The source of the transistor QN is coupled to the low potential power VSS. The node between the transistors QP and QN correspond to the node X. Each of the transistors QP and QN are manufactured so as to have a desired operation speed RS1. The operation speed RS1 is set the same as the desired operation speed of the MOS transistors provided within the internal circuit 2.

During a test operation, the high potential power VDD is normally supplied to the gate of the transistor QP. This normally inactivates the transistor QP, and a leak current Irp flows between the source and the drain of the transistor QP. A body bias (substrate voltage) VNW at the PMOS side is also supplied to the backgate of the transistor QP. The body bias VNW is normally set to the high potential power VDD as a first body bias.

The low potential power VSS is normally supplied during the testing operation to the gate of the transistor QN. In this way, the transistor QN is normally inactivated and a leak current Irn flows between the source and the drain of the transistor QN. A body bias (substrate voltage) VPW at the NMOS transistor side is also supplied to the backgate of the transistor QN. The body bias VPW is normally set to the low potential power VSS as a second body bias.

The potential Vx at the node X between the transistors QP and QN, that is, the potential Vx caused by the difference between the leak current Irn at the transistor QN side and the leak current Irp at the transistor QP side, is supplied to the non-inversion input terminal of the comparator 20. A reference voltage Vref is supplied to the inversion input terminal of the comparator 20. The reference voltage Vref is a voltage obtained from a previously conducted simulation and the actual device. Further, the reference voltage Vref is a voltage set so that the operation speeds of the PMOS transistor and NMOS transistor are within the guaranteed operational range. The comparator 20 compares the potential Vx of the node X with the reference voltage Vref, and generates an output signal OUT which corresponds to the comparison result.

The setting of the reference voltage Vref is described below.

The guaranteed operational range set during the design stage of the PMOS transistor and NMOS transistor is described first with reference to FIG. 3.

Figure 3A:
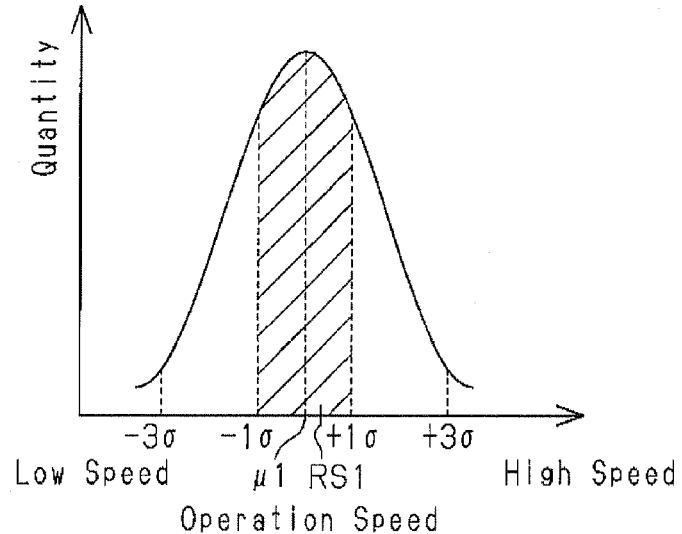
FIGS. 3A and 3B are graphs showing the operational error range of each MOS transistor.

FIG. 3A shows an example of a graph of the distribution of the operation speed of the actually manufactured PMOS transistor when a plurality of PMOS transistors are manufactured so as to have the same characteristics (for example, operation speed RS1). As shown in FIG. 3A, the distribution of the operation speed of the manufactured PMOS transistors is expressed by a standard distribution which includes a desired operation speed RS1 near a center value μ1.

Figure 3B:
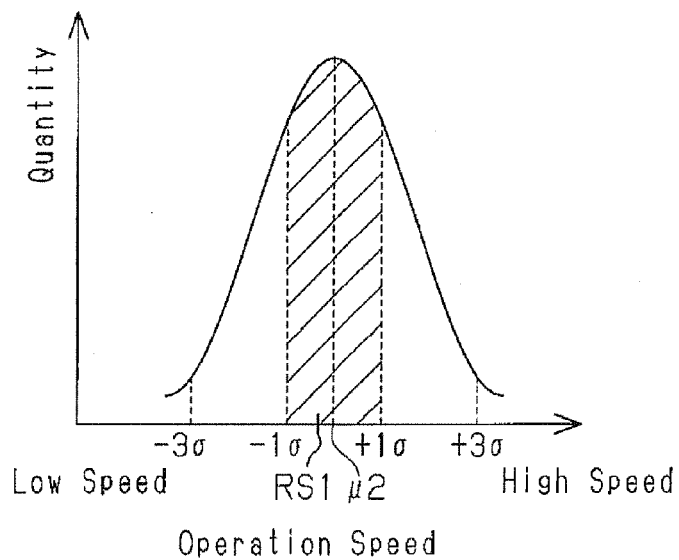

Similarly, FIG. 3B shows an example of a graph of the distribution of the operation speeds of actually manufactured NMOS transistors when the NMOS transistors are manufactured so as to have the same characteristics (for example, operation speed RS1). As shown in FIG. 3B, the distribution of the operation speeds of the manufactured NMOS transistors is expressed by a standard distribution which includes a desired operation speed RS1 near a center value μ2.

Assuming the desired operation speed RS1 as being a center and that a transistor has been fabricated with an operation speed slower than the operation speed RS1 and a transistor has been fabricated with an operation speed faster than the operation speed RS1, the ranges between variance −1σ~+σ and variance −3σ~+3σ are normally set as the guaranteed operational ranges. In the present embodiment, the guaranteed operational range designed for the PMOS transistors and NMOS transistors is set in the range between variance −1σ to +1σ. Therefore, proper logical operation is guaranteed for both the NMOS transistors, which have a variance of −1σ to +1σ, and the PMOS transistors, which have a variance of −1σ to +1σ. In other words, if the operation speeds of both of the PMOS transistor and NMOS transistor are set at operation speeds within the range of a variance of −1σ to +1σ, an inverter circuit, for example, which is configured by these transistors, will properly perform logical operations.

In the present embodiment, the lower limit voltage value VL and the upper limit voltage value VH, which are set so that the operation speeds of both MOS transistors are within a range of variance −1σ to +1σ, are selectively supplied to the comparator 20 as the reference voltage Vref. The setting of the lower limit voltage value VL and upper limit voltage value VH is described below. The center value 12 of the operation speed distribution of the NMOS transistor is set faster than the center value μ1 of the operation speed distribution of the PMOS transistor, as shown in FIG. 3.

The lower limit voltage VL is set by performing a simulation in which the PMOS leak unit 10P is configured by a PMOS transistor with variance −1σ, and the NMOS leak unit 10N is configured by an NMOS transistor with variance +1σ. That is, the potential Vx at the node X, which is produced by the difference between the leak current Irn of the NMOS transistor, which has a variance of +1σ, and the leak current Irp of the PMOS transistor, which has a variance of −1σ, is measured and the potential Vx is set as the lower limit voltage VL. The lower limit voltage VL is thus set at the potential Vx of the node X produced when the difference in the operation speeds of the PMOS transistor and NMOS transistor is maximum and within the guaranteed operational range, that is, when the NMOS transistor has a higher speed than the PMOS transistor.

The upper limit voltage VH is set by performing a simulation in which the PMOS leak unit 10P is configured by a PMOS transistor, which has a variance of +1σ, and the NMOS leak unit 10N, which is configured by an NMOS transistor having a variance of −1σ. That is, the potential Vx of the node X, which is produced by the difference between the leak current Irn of the NMOS transistor, which has a variance of −1σ, and the leak current Irp of the PMOS transistor, which has a variance of +1σ, is measured and the potential Vx is set as the upper limit voltage VH. The upper limit voltage VH is thus set at the potential Vx at the node X produced when the difference in the operation speeds of the PMOS transistor and NMOS transistor is maximum and within the guaranteed operational range, that is, when the PMOS transistor has a higher speed than the NMOS transistor. Therefore, when the PMOS and NMOS leak units 10P and 10N are configured by transistors QP and QN, as shown in FIG. 2, the operation speeds of both the transistors QP and QN can be set within the guaranteed operational range by setting the potential Vx at the node X to be lower than the upper limit voltage value VH and higher than the lower limit voltage value VL (VL<Vx<VH).

The upper limit voltage value VH and lower limit voltage value VL set in the manner described above are selectively supplied as the reference voltage Vref to the inversion input terminal of the comparator 20. Then, the comparator 20 supplies the output signal OUT, which corresponds to the comparison result of the potential Vx and the reference voltage Vref, to the control circuit 30. The switching of the upper limit voltage value VH and lower limit voltage value VL is controlled by the control circuit 30.

As shown in FIG. 1, the control circuit 30 generates control signals CP and CN based on the set reference voltage Vref and the input output signal OUT. Specifically, the control circuit 30 generates control signals CPL and CNL based on the output signal OUT, which indicate that the potential Vx is a low voltage that is lower than the lower limit voltage value VL (Vx<VL). The control circuit 30 also generates a control signal CPH configuring a first control signal and a control signal CNH configuring a second control signal based on the output signal OUT, which indicates that the potential Vx is a high voltage and greater than the upper limit voltage value VH (VH<Vx). Then, the control circuit 30 provides the generated control signal CP to the PMOS body bias generation circuit 40 and provides the generated control signal CN to the NMOS body bias generation circuit 50.

The PMOS body bias generation circuit 40 generates a body bias VNW of the high potential power VDD used by the PMOS transistor when the control signal CP is not received from the control circuit 30. Specifically, the PMOS body bias generation circuit 40 reduces the body bias VNW by a predetermined partial voltage when the control signal CPL is received. The PMOS body bias generation circuit 40 also increases the body bias VNW by a predetermined partial voltage when the control signal CPH is received. The voltage value of the body bias VNW may also be higher than the high potential power VDD. Then, the PMOS body bias generation circuit 40 supplies the body bias VNW to the backgate of the transistor QP, which configures the PMOS leak unit 10P, and supplies the body bias VNW to the backgate of each PMOS transistor (not shown) in the internal circuit 2.

The NMOS body bias generation circuit 50 generates a body bias VPW at the NMOS transistor side if the voltage value is the low potential power VSS when the control signal CN is not received from the control circuit 30. The NMOS body bias generation circuit 50 reduces the body bias VPW by a predetermined partial voltage based on the input control signal CN. Specifically, the NMOS body bias generation circuit 50 reduces the body bias VPW by a predetermined voltage difference when the control signal CNL is received. The NMOS body bias generation circuit 50 also increases the body bias VPW by a predetermined voltage difference when the control signal CNH is received. The voltage value of the body bias VPW may also be lower than the low potential power VSS (for example, a negative voltage). Then, the NMOS body bias generation circuit 50 supplies the body bias VPNW to the backgate of the transistor QN configuring the NMOS leak unit 10N and supplies the body bias VPW to the backgate of each NMOS transistor (not shown) in the internal circuit 2.

The body bias control circuit is configured by the comparator 20, control circuit 30, PMOS body bias generation circuit 40, and NMOS body bias generation circuit 50 as a comparator circuit.

The testing operation in the testing circuit 3 of the semiconductor device 1 configured as described above will now be discussed based on the flowchart shown in FIG. 4. Described below is a testing operation for generating the body biases VNW and VPW of predetermined voltage values for reducing the variation of characteristics of the transistors within the semiconductor device 1.

The control circuit 30 first sets the reference voltage Vref, which is supplied to the inversion input terminal of the comparator 20, as the lower limit voltage value VL (step S1). In the comparator 20, the potential Vx of the node X input to the non-inversion terminal is compared to the lower limit voltage value VL. An output signal OUT corresponding to the comparison result is then provided from the comparator 20 to the control circuit 30. The control circuit 30 then determines the signal level of the output signal OUT (step S2). When the output signal OUT has an L level at this time, that is, when the potential Vx is a low voltage that is less than the lower limit voltage value VL (Vx<VL), the control circuit 30 generates the control signals CPL and CNL (step S3).

Specifically, when the leak current Irn in the transistor QN exceeds the leak current Irp in the transistor QP, the potential Vx of the node X approaches the low potential power VSS. Therefore, when the potential Vx of the node X is a low voltage and less than the lower limit voltage value VL, the leak current Irn in the transistor QN becomes greater than the leak current Irp in the transistor QP. That is, the operation speed of the transistor QN is faster than the operation speed of the transistor QP when the potential Vx of the node X is lower than the lower limit voltage value VL. Therefore, in step S3, the control circuit 30 generates the control signal CPL for lowering the body bias VNW, and generates the control signal CNL for lowering the body bias VPW.

The control circuit 30 then provides the control signals CPL and CNL to the body bias generation circuits 40 and 50. The PMOS body bias generation circuit 40 reduces the body bias VNW by a predetermined voltage difference based on the control signal CPL. The NMOS body bias generation circuit 50 also reduces the body bias VPW by a predetermined voltage difference based on the control signal CNL. The changed body bias VNW is then supplied to the transistor QP and the changed body bias VPN is supplied to the transistor QN. In this state, the routine returns to step S1. When the body bias VNW decreases, the operation speed increases in the transistor QP, and the leak current Irp increases in the transistor QP. When the body bias VPW decreases, the operation speed decreases in the transistor QN, and the leak current Irn decreases in the transistor QN.

When the output signal OUT has an H level in step S2, the control circuit 30 switches the reference voltage Vref to the upper limit voltage value VH (step S4). Then, the output signal OUT, which corresponds to the comparison result of the potential Vx of the node X and the upper limit voltage value VH, is supplied from the comparator 20 to the control circuit 30. The control circuit 30 then determines the signal level of the output signal OUT (step S5). When the output signal OUT has an H level in this state, that is, when the potential Vx is higher than the upper limit voltage value VH (VH<Vx), the control circuit 30 generates the control signals CPH and CNH (step S6).

When the leak current Irp in the transistor QP exceeds the leak current Irn in the transistor QN, the potential Vx at the node X approaches the high potential power VDD. Therefore, when the potential Vx of the node X is greater than the upper limit voltage value VH, the leak current Irp in the transistor QP is greater than the leak current Irn in the transistor QN. That is, when the potential Vx of the node X is a voltage that is greater than the upper limit voltage value VH, the operation speed of the transistor QP is faster than the operation speed of the transistor QN. Accordingly, in step S6, the control circuit 30 generates the control signal CPH, which increases the body bias VNW, and generates the control signal CNH, which increases the body bias VPW.

The control circuit 30 then provides the control signals CPH and CNH to the body bias generation circuits 40 and 50. The PMOS body bias generation circuit 40 increases the body bias VNW by a predetermined voltage difference based on the control signal CPH. The NMOS body bias generation circuit 50 also increases the body bias VPW by a predetermined voltage difference based on the control signal CNH. Then, the changed body bias VNW is supplied to the transistor QP and the changed body bias VPW is supplied to the transistor QN. In this state, the routine returns to step S1. When the body bias VNW increases, the operation speed decreases in the transistor QP, and the leak current Irp decreases in the transistor QP. When the body bias VPW increases, the operation speed of the transistor QN increases, and the leak current increases in the transistor QN.

When the output signal OUT has an L level in step S5, the control circuit 30 ends the testing operation since the potential Vx is a voltage that is greater than the lower limit voltage value VL and lower than the upper limit voltage value VH (VL<Vx<VH). That is, the control circuit 30 ends the testing operation when the operation speeds of both of the transistors QP and QN configuring the leak units 10P and 10N are set within the guaranteed operational range. Then, the PMOS body bias generation circuit 40 supplies the body bias VNW to the backgate of the PMOS transistors in the internal circuit 2 when the operation speeds of both transistors QP and QN have been set within the guaranteed operational range (at the completion of the testing time). The NMOS body bias generation circuit 50 also supplies the body bias VPW from the completion of the testing operation to the backgate of the NMOS transistors within the internal circuit 2 during normal operation. In this way, the operation speeds of the various transistors in the internal circuit 2 are set within the guaranteed operational range during normal operation.

The semiconductor device 1 of the first embodiment has the advantages described below.

(1) The normally inactivated PMOS transistor QP and the normally inactivated NMOS transistor QN are coupled in series between the high potential power VDD and the low potential power VSS. The potential Vx is detected at node X between the two transistors QP and QN. In this state, the potential Vx at the node X is a potential corresponding to the comparison result of the leak current Irp in the transistor QP and the leak current Irn in the transistor QN, that is, a potential produced by the difference between the leak current Irp and the leak current Irn. Therefore, the leak currents Irp and Irn can be compared by an extremely simple structure in which the PMOS transistor QP and the NMOS transistor QN are coupled in series. This allows for avoiding an increase in the scale of the circuit for comparing the leak current Irp of the transistor QP and the leak current Irn of the transistor QN.

Furthermore, the detection circuit 10 is configured by the PMOS transistor QP, which is a detection subject, and the NMOS transistor QN, which is a detection subject. This allows for components of transistors other than the detection subjects from being included in the potential Vx. Thus, the accuracy of the comparison of the leak current Irp of the transistor QP and the leak current Irn of the transistor QN, that is, the detection accuracy of the potential Vx, is improved.

(2) The voltage values of the body biases VNW and VPW are respectively controlled based on the potential Vx, which corresponds to the comparison result of the leak current Irp of the transistor QP and the leak current Irn of the transistor QN. In this way, the operation speeds of the PMOS transistors and NMOS transistors may be individually controlled.

(3) The voltage values of the body biases VNW and VPW are respectively controlled in accordance with the comparison result of the potential Vx and reference voltage Vref. In this way, the body biases VNW and VPW may be controlled in accordance with the reference voltage Vref that is set by the result of previous simulation. Therefore, variations in the element characteristics (operation speed) of each NMOS transistor in the internal circuit 2 may be reduced in a preferable manner.

(4) The lower limit voltage value VL and upper limit voltage value VH, which represent the voltage range for setting the operation speeds of the transistors QP and QN so as to be within the guaranteed operational range, are supplied to the comparator 20 as the reference voltage Vref. The operation speeds of both transistors QP and QN can be set within the guaranteed operational range by setting the potential Vx of the node X so as to be higher than the lower limit voltage value VL and lower than the upper limit voltage value VH. Therefore, the logical operations may be normally performed by each MOS transistor within the internal circuit 2.

(5) The leak units 10P and 10N are configured by the transistors QP and QN, which are manufactured so that the MOS transistors actually used in the internal circuit 2 have the desired operation speeds RS1 and RS2. In this way, the voltage values of the body biases VNW and VPW may be controlled based on the leak currents in the transistors QP and QN, which have the same element characteristics as the MOS transistors actually used in the internal circuit 2. Therefore, the variation of element characteristics (operation speed) of the MOS transistors in the internal circuit 2 may be reduced in a preferable manner.

(6) The potential Vx at the node X is detected when the changed voltage body biases VNW and VPW have been respectively supplied to the backgates of the transistors QP and QN. This allows for further testing to be performed with the corrected element characteristics of the transistors QP and QN. Accordingly, variations in the element characteristics of the transistors QP and QN may be reduced with further accuracy.

Figures 4, 5:
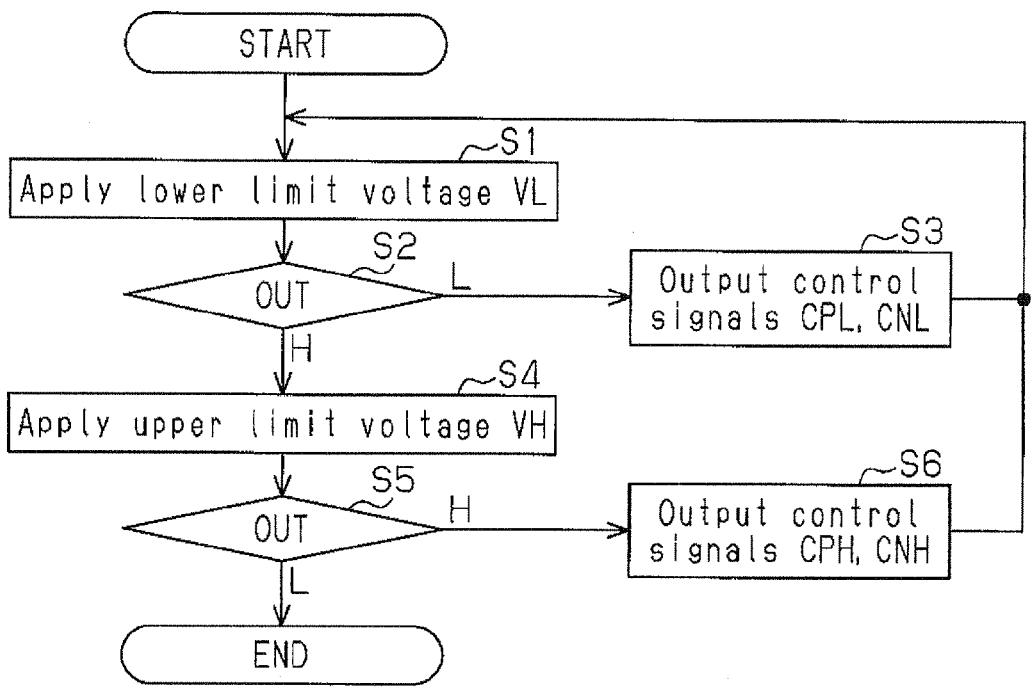
FIG. 4 is a flowchart showing the test operation of the testing circuit of FIG. 1.
FIG. 5 is a table showing the operation of a control circuit in a second embodiment of the present invention.
Figure 6:
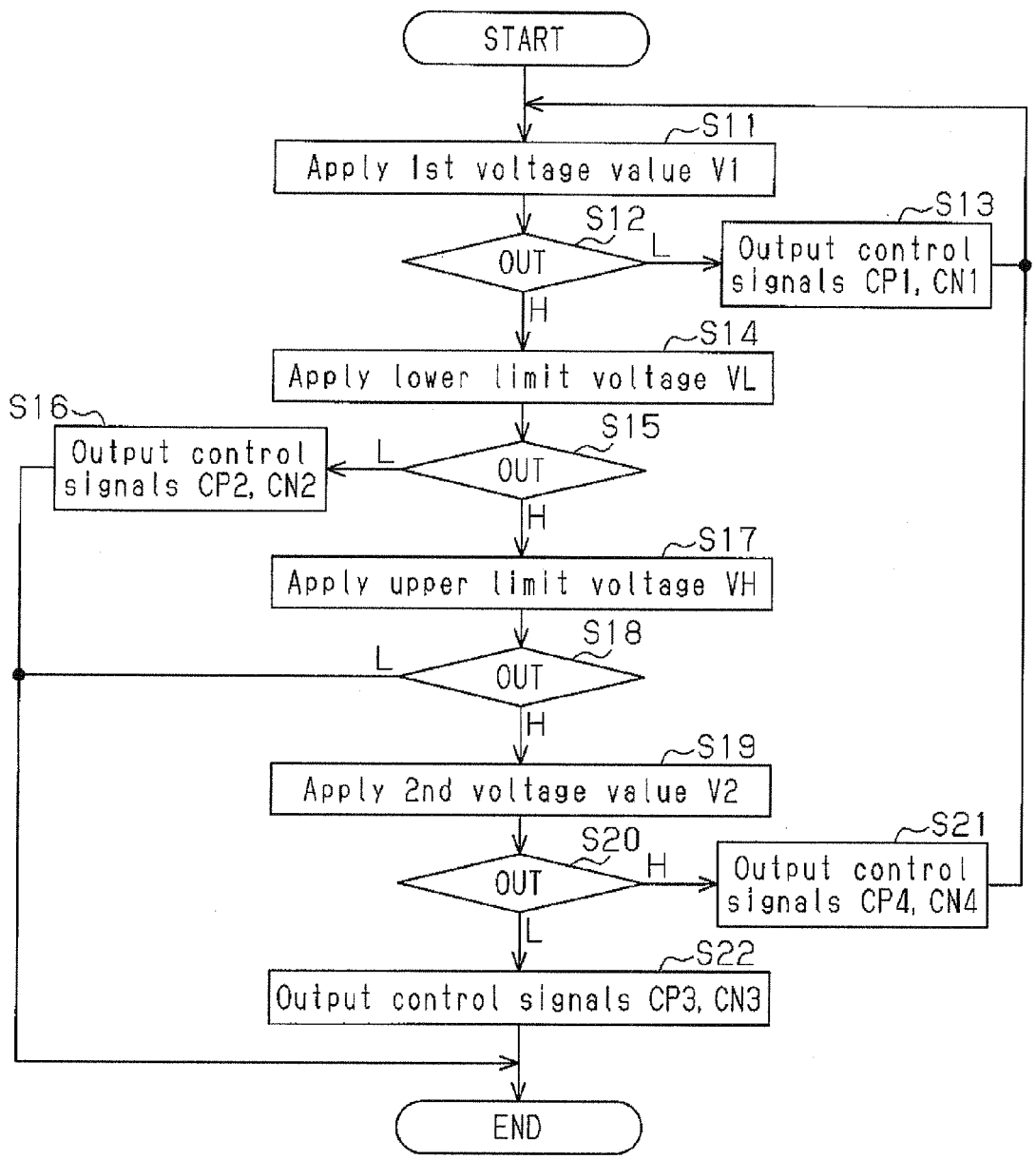
FIG. 6 is a flowchart showing the testing operation of the testing circuit of the second embodiment of the present invention.

A second embodiment of a semiconductor device 1 according to the present invention with reference to FIGS. 5 and 6. The semiconductor device 1 of the second embodiment differs from the first embodiment in that the voltage value set as the reference voltage Vref is supplied to the comparator 20. The control circuit 30 of the second embodiment generates a control signal to finely control the setting of the body bias. Components that are the same as those of FIGS. 1 through 4 are given the same reference numbers and will not be described in detail.

The lower limit voltage value VL, upper limit voltage value VH, first voltage value V1, and second voltage value V2 are selectively supplied as the reference voltage Vref to the inversion input terminal of the comparator 20. The relationship among the magnitudes of these voltage values are expressed by the equation shown below.

V1<VL<VH<V2

In the present embodiment, the operation speeds of the transistors QP and QN are set within the guaranteed operational range when the potential Vx of the node X is a voltage that is higher than the lower limit voltage value VL and less than the upper limit voltage value VH (VL<Vx<VH). The switching of each voltage value is controlled by the control circuit 30.

The control circuit 30 generates the control signals CP1 through CP4 and the control signals CN1 through CN4 based on the voltage value of the reference voltage Vref and the signal level of the output signal OUT from the comparator 20.

Specifically, the control circuit 30 generates the control signals CP1 and CN1 (third control signal) when condition C1 (Vx<V1) is met, as shown in FIG. 5. The control signal CP1 and the control signal CN1 respectively reduce the body bias VNW and the body bias VPW by a correction voltage VC1 (first and second correction voltages). The control circuit 30 also generates the control signals CP2 and CN2 (fourth control signal) when condition C2 (V1<Vx<VL) is met. The control signal CP2 and control signal CN2 respectively reduce the body biases VNW and VPW by a correction voltage VC2 (first and second correction voltages). The correction voltage VC2 is set to be lower than the correction voltage VC1 beforehand through a simulation or the like.

More specifically, a simulation is performed to check how much the body biases VNW and VPW have to be reduced to change the relationship of V1<Vx<VL to the relationship of VL<Vx<VH, and the voltage value of the correction voltage VC2 is set based on this simulation result. The control circuit 30 also ends the testing operation when condition C3 (VL<Vx<VH) is met.

The control circuit 30 also generates the control signals CP3 and CN3 (fifth control signal) when condition C4 (VH<Vx<V2) is met. The control signals CP3 and CN3 respectively increase the body biases VNW and VPW by a correction voltage VC3 (third and fourth correction voltages). The correction voltage VC3 is set beforehand by a simulation and set at a voltage that is lower than the correction voltage VC4, which will be described later. That is, a simulation is performed beforehand to change the relationship VH<Vx<V2 to the relationship VL<Vx<VH, and the voltage value of the correction voltage VC4 is set based on this simulation result. The control circuit 30 generates the control signals CP4 and CN4 (sixth control signal) when condition C5 (V2<Vx) is met. The control signals CP4 and CN4 respectively increase the body biases VNW and VNP by the correction voltage VC4 (third and fourth correction voltages).

The testing operation of the testing circuit 3 of the semiconductor device 1 configured in this manner will now be described with reference to the flowchart of FIG. 6.

The control circuit 30 first sets the reference voltage Vref, which is supplied to the to the inversion input terminal of the comparator 20, to a first voltage value V1 (step S11). Then, the output signal OUT corresponding to the comparison result of the potential Vx and the first voltage value V1 is provided from the comparator 20 to the control circuit 30. Then, the control circuit 30 determines the signal level of the output signal OUT (step S12). When the output signal OUT has an L level, that is, when the potential Vx is a voltage lower than the first voltage value V1 (condition C1), the control circuit 30 generates the control signals CP1 and CN1 and provides the control signals CP1 and CN1 to the body bias generation circuits 40 and 50, respectively (step S13).

The PMOS body bias generation circuit 40 reduces the body bias VNW by the correction voltage VC1 based on the control signal CP1. The NMOS body bias generation circuit 50 reduces the body bias VPW by the correction voltage VC1 based on the control signal CN1. The changed body bias VNW is then supplied to the transistor QP and the changed body bias VPW is supplied to the transistor QN. Then, the routine returns to step S1.

When the output signal OUT has an H level in step S12, the control circuit 30 switches the reference voltage Vref to the lower limit voltage value VL (step S14). Then, the output signal OUT corresponding to the comparison result of the potential Vx and the lower limit voltage value VL is provided from the comparator 20 to the control circuit 30. The control circuit 30 then determines the signal level of the output signal OUT (step S15). When the output signal OUT has an L level at in this state, that is, when the potential Vx is such that V1<Vx<VL is satisfied (condition C2), the control circuit 30 generates the control signals CP2 and CN2 and provides the control signals CP2 and CN2 to the body bias generation circuits 40 and 50, respectively (step S16).

The PMOS body bias generation circuit 40 reduces the body bias VNW by the correction voltage VC2 based on the control signal CP2. The NMOS body bias generation circuit 50 reduces the body bias VPW by the correction voltage VC2 based on the control signal CN2. When the changed body biases VNW and VPW are respectively supplied to the transistors QP and QN, the potential Vx is changed to the relationship of VL<Vx<VH (condition C3). Therefore, the control circuit 30 ends the testing operation.

When the output signal OUT has an H level in step S15, the control circuit 30 switches the reference voltage Vref to the upper limit voltage value VH (step S17). Then, the output signal OUT corresponding to the comparison result of the potential Vx and the upper limit voltage value VH is provided from the comparator 20 to the control circuit 30. The control circuit 30 then determines the signal level of the output signal OUT (step S18). When the output signal OUT has an L level in this state, that is, when the potential Vx is such that VL<Vx<VH is satisfied (condition C3), the control circuit 30 ends the testing operation.

When the output signal OUT has an H level in step S18, the control circuit 30 switches the reference voltage Vref to the second voltage value V2 (step S19). The output signal OUT corresponding to the comparison result of the potential Vx and the second voltage value V2 is provided from the comparator 20 to the control circuit 30. The control circuit 30 then determines the signal level of the output signal OUT (step S20). When the output signal OUT has an H level in this state, that is, when the potential Vx is such that V2<Vx is satisfied (condition C5), the control circuit 30 generates the control signals CP4 and CN4 and provides the control signals CP4 and CN4 to the body bias generation circuits 40 and 50, respectively (step S22).

The PMOS body bias generation circuit 40 increases the body bias VNW by the correction voltage VC4 based on the control signal CP4. The NMOS body bias generation circuit 50 increases the body bias VPW by the correction voltage VC4 based on the control signal CN4. The changed body bias VNW is supplied to the transistor QP, and the changed body bias VPW is supplied to the transistor QN. Then, the routine returns to step S11.

When the output signal OUT has an L level in step S20, that is, when the potential Vx is such that VH<Vx<V2 is satisfied (condition C4), the control circuit 30 generates the control signals CP3 and CN3 and provides the control signals CP3 and CN3 to the body bias generation circuits 40 and 50, respectively (step S22).

The PMOS body bias generation circuit 40 reduces the body bias VNW by the correction voltage VC3 based on the control signal CP3. The NMOS body bias generation circuit 50 reduces the body bias VPW by the correction voltage VC3 based on the control signal CN3. When the body biases VNW and VPW, which are set in this manner, are respectively supplied to the backgates of the transistors QP and QN, the control circuit 30 ends the testing operation since the potential Vx at the node X is changed to the relationship of VL<Vx<VH.

When the testing operation shown in FIG. 6 ends, the PMOS body bias generation circuit 40 supplies the backgate of the PMOS transistors in the internal circuit 2 during normal operation with the body bias VNW that is determined when the potential Vx is set such that VL<Vx<VH is satisfied. The NMOS body bias generation circuit 50 also supplies the backgates of the NMOS transistors in the internal circuit 2 during normal operation with the body bias VPW determined when the potential Vx is set such that VL<Vx<VH is satisfied.

The semiconductor device 1 of the second embodiment has the advantages described below.

(1) In addition to the lower limit voltage value VL and upper limit voltage value VH supplied as the reference voltage Vref, the first voltage value V1 which is lower than the lower limit voltage value VL, and a second voltage value V2, which is higher than the upper limit voltage value VH, are also supplied to the comparator 20. The variation of the element characteristics of the transistors QP and QN are accurately reduced by the correction voltages VC1 through VC4, which are preset in accordance with the relationship of the magnitudes of the potential Vx and the first voltage value V1 and second voltage value V2.

Further, the potential Vx may be changed to obtain the relationship of VL<Vx<VH by once changing the voltage values of the body biases VNW and VPW when the potential Vx is such that V1<Vx<VL (condition C2) or VH<Vx<V2 (condition C4) is satisfied. This allows for reduction in the time required for the testing operation.

A third embodiment of a semiconductor device 1 according to the present invention will now be described with reference to FIG. 7. The semiconductor device 1 of the third embodiment differs from the first and second embodiments in the structures of the PMOS leak unit 10P and the NMOS leak unit 10N. Components that are the same as those of FIGS. 1 through 4 are given the same reference numbers and will not be described in detail.

Figure 7:
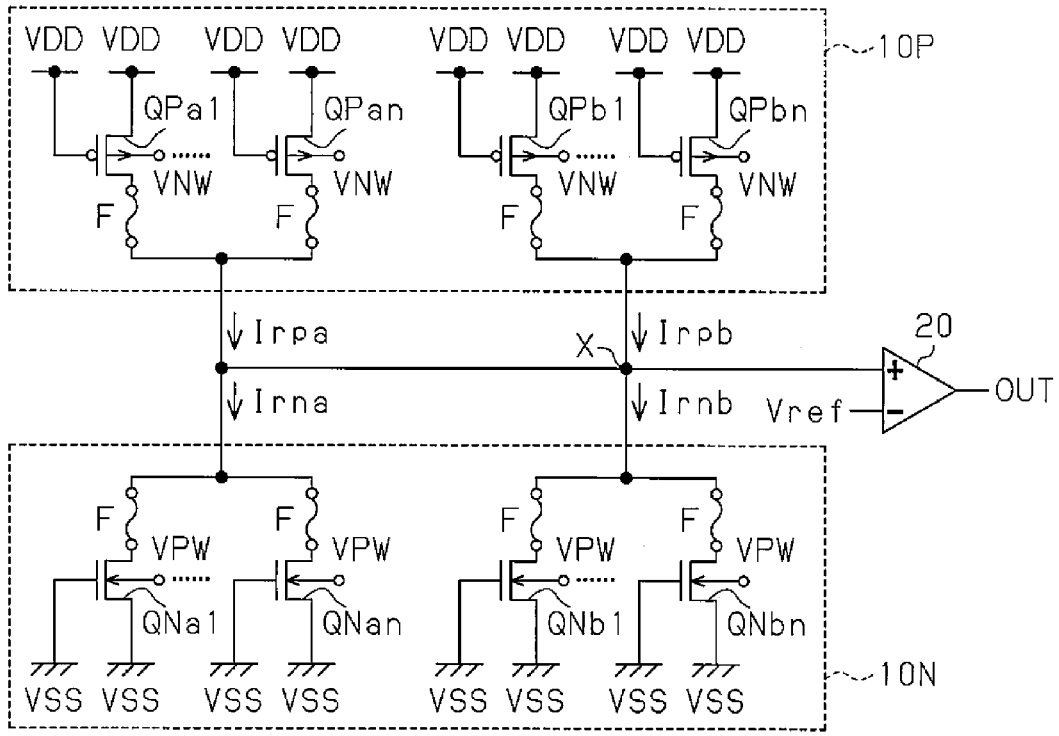
FIG. 7 is a circuit diagram showing the internal structure of the testing circuit in a third embodiment of the present invention.
Figure 8:
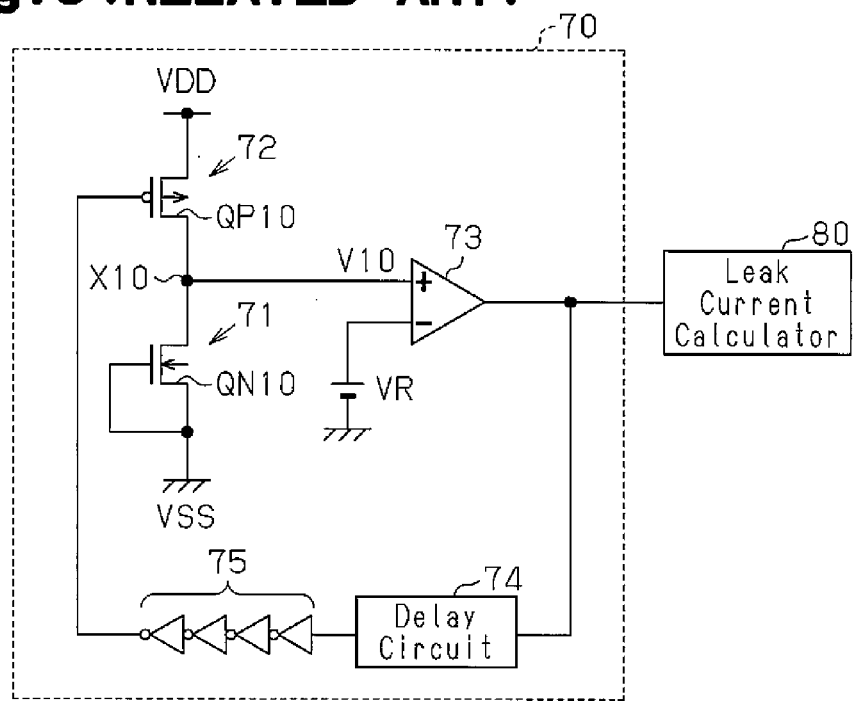
FIG. 8 is a block diagram showing the overall structure of a conventional leak current detection circuit.
Figure 9:
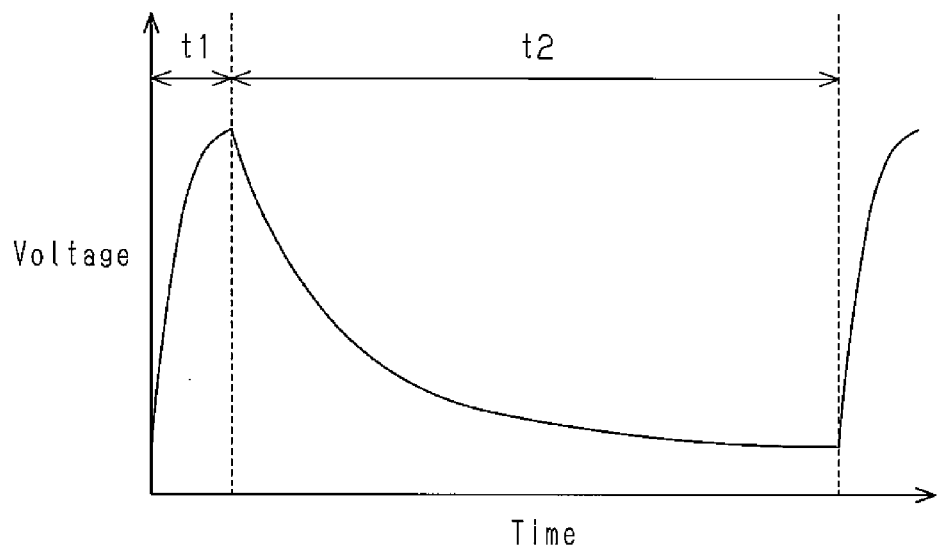
FIG. 9 is a graph showing the charging time and discharging time of the conventional leak current detection circuit.
Figure 10:
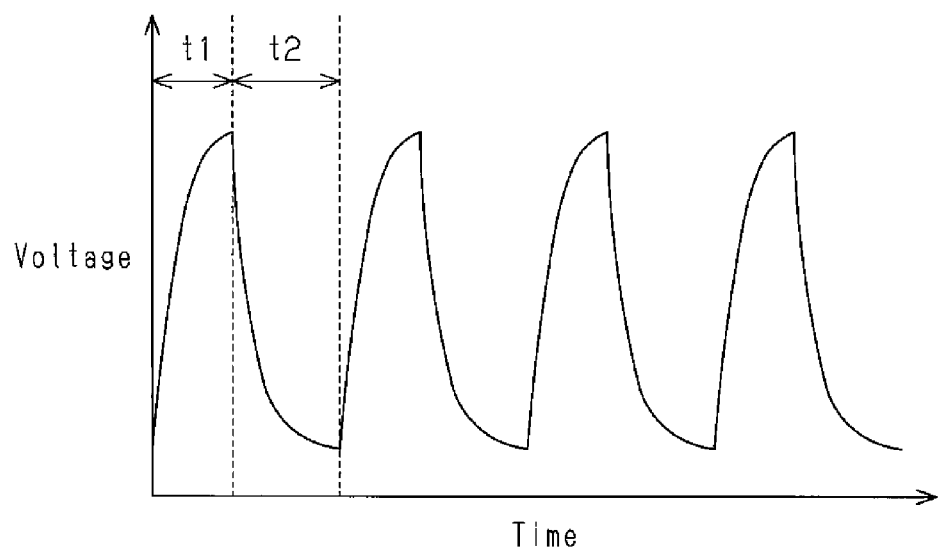
FIG. 10 is a graph showing the charging time and discharging time of the conventional leak current detection circuit.

As shown in FIG. 7, the PMOS leak unit 10P is configured by an n number (for example, ten) of PMOS transistors QPa1 through QPan, and an n number of PMOS transistors QPb1 through QPbn. The NMOS leak unit 10N is configured by an n number of transistors QNa1 through QNan, and an n number of NMOS transistors QNa1 through QNan. The drain of each transistor is coupled to a node X via a fuse element F. The PMOS transistors QPa1 through QPan and the NMOS transistors Qna1 through QNan are manufactured so as to have an operation speed RS1. The PMOS transistors QPb1 through QPbn and the NMOS transistors QNb1 through QNbn are manufactured so as to have an operation speed RS2, which differs from the operation speed RS1. That is, the PMOS transistors QPa1 through QPan (NMOS transistors QNa1 through QNan) differ in characteristics (operation speeds and the like) from the PMOS transistors QPb1 through QPbn (NMOS transistors QNb1 through QNbn). The operation speeds RS1 and RS2 are both set to be the same as the operation speeds of the transistors that are actually used in the internal circuit 2.

The quantity of the PMOS transistors QPa1 through QPan (NMOS transistors QNa1 through QNan), which have the operation speed RS1, and the quantity of the PMOS transistors QPb1 through QPbn (NMOS transistors QNb1 through QNbn), which have the operation speed RS2, may be set in accordance with the ratio of the transistors for each characteristic used in the internal circuit 2. That is, when the transistors with the operation speed RS1 and the transistors with the operation speed RS2 are used in the internal circuit 2 with a ratio of 7:3, only seven PMOS transistors Qpa1 through Qpa7 and three PMOS transistors QPb1 through QPb3 are used as the PMOS leak unit 10P. In the present embodiment, the quantity of the transistors used in the PMOS leak unit 10P is set by breaking the fuse elements F coupled to the remaining PMOS transistors QPa8 through QPa10 and QPb4 through QPb10 in the PMOS leak unit 10P. In the same manner, the quantity of the transistors used in the NMOS leak unit 10N is set so as to use only the seven NMOS transistors Qna1 through Qna7 and three NMOS transistors QNb1 through QNb3 by breaking the fuse elements F of the transistors.

When setting the quantity of transistors to configure the leak units 10P and 10N, the potential VX at the node X, which is produced by the difference between the leak current in the PMOS leak unit 10P and the leak current in the NMOS leak unit 10N, is supplied to the comparator 20. The leak current in the PMOS leak unit 10P is a combination of the leak current Irpa of the seven PMOS transistors QPa1 through QPa7 and the leak current Irpb of the three PMOS transistors QPb1 through QPb3. The leak current in the NMOS leak unit 10N is also a combination of the leak current Irna of the seven NMOS transistors QNa1 through QNa7 and the leak current Irnb of the three NMOS transistors QNb1 through QNb3.

The semiconductor device 1 of the third embodiment has the advantages described below.

(1) The leak units 10P and 10N are configured by a plurality of MOS transistors which have different desired element characteristics (operation speeds). Thus, variations in the element characteristics of every one of the MOS transistors in the internal circuit 2 may be reduced even when a design specifies plural types of MOS transistors that have different element characteristics in the internal circuit 2.

(2) The quantity of the transistors having different operation speeds RS1 and RS2 that are used is set in accordance with the ratio of the transistors for each characteristic used in the internal circuit 2. This allows for the MOS transistors in the internal circuit 2 to be reproduced in a simulated manner in the detection circuit 10. Therefore, variations in the element characteristics (operation speed) of all of the MOS transistors in the internal circuit 2 may be reduced when the body biases VNW and VPW are controlled based on the potential Vx detected by the detection circuit 10.

The above-described embodiments may also be practiced in the forms described below.

In the third embodiment, the number of the transistors used in the detection circuit 10 is set by breaking the fuse elements F coupled to the transistors in the detection circuit 10. However, the present invention is not limited to such an arrangement. Transistors may be arranged in bulk in the design stage. Then, after determining the ratio of the transistors for each characteristic in the internal circuit 2, the bulk of the transistors in the detection circuit 10 that are used in the detection circuit 10 may be wired with a CAD based on the number used that is set in accordance with the ratio.

In the third embodiment, the detection circuit 10 is formed taking into consideration the ratio of the transistors for each characteristic used in the internal circuit 2. However, the detection circuit 10 may also be formed, for example, by a plurality of types of PMOS transistors and NMOS transistors having different element characteristics.

In each of the above-described embodiments, the present invention is not particularly limited in the type of voltage value set as the reference voltage Vref. For example, although the single first voltage V1, which is lower than the lower limit voltage value VL, is set as the reference voltage Vref in the second embodiment, a plurality of voltage values may also be set as a voltage that is less than the lower limit voltage value VL.

In the second embodiment, the voltage values of the body biases VNW and VPW are changed by the same correction voltages VC1 through VC4. However, the present invention is not limited to such an arrangement, and the voltage values of the body biases VNW and VPW may each be changed by different voltage values.

In the second embodiment, the testing operation ends after steps S16 and S22 shown in FIG. 6. However, the present invention is not limited to such an arrangement, and the routine may also return to step S11 after the processes of steps S16 and S22.

In the above embodiments, the PMOS transistors configuring the PMOS leak unit 10P and NMOS transistors configuring the NMOS leak unit 10N are set to be the same in number. However, the present invention is not limited to such an arrangement, and the number of PMOS transistors configuring the PMOS leak unit 10P may differ from the number of the NMOS transistors configuring the NMOS leak unit 10N.

In the above embodiments, the voltage values of the body biases VNW and VPW are both controlled. However, the present invention is not limited to such an arrangement. For example, the voltage value of the body bias VNW may be controlled alone.

In the above embodiments, the testing circuit 3 is set so as to operate only during the testing time. However, the testing circuit 3 may also be set, for example, to operate in accordance with each operating mode. For example, the testing circuit 3 may also be operated whenever the operating mode is switched.

Although the internal circuit 2 and the testing circuit 3 are formed on the same substrate in the above embodiments, the internal circuit 2 and the testing circuit 3 may also be formed on separate substrates.

What is claimed is:

1. A leak current detection circuit comprising:
at least one P-channel MOS transistor which is coupled to a high potential power supply and which is constantly inactivated during a test operation and generates a first leak current, wherein the at least one P-channel MOS transistor includes a first backgate controlled by a first control signal;
at least one N-channel MOS transistor which is coupled between a low potential power supply and the at least one P-channel MOS transistor and which is constantly inactivated during the test operation and generates a second leak current, wherein the at least one N-channel MOS transistor includes a second backgate controlled by a second control signal; and
a detector which detects a potential generated at a node between the at least one P-channel MOS transistor and the at least one N-channel MOS transistor and indicating a difference between the first and second leak currents,
wherein the first control signal and the second control signal are generated based on the potential indicating the difference.

2. The leak current detection circuit according to claim 1, wherein:
the first leak current of the at least one P-channel MOS transistor is controlled by a first body bias, and the second leak current of the at least one N-channel MOS transistor is controlled by a second body bias;
the detector includes a comparator which compares the potential that is in accordance with the first and second leak currents with a reference voltage to generate an output signal indicating the comparison result; and
either one of the first body bias and the second body bias is changed based on the output signal of the comparator.

3. The leak current detection circuit according to claim 2, wherein:
the reference voltage is changed based on the output signal generated by the comparator after either one of the first body bias and the second body bias changes; and
the comparator is configured so as to compare the potential that is in accordance with the first and second leak currents with the changed reference voltage.

4. The leak detection circuit according to claim 3, wherein the reference voltage is set to either one of an upper limit voltage value and a lower limit voltage value that sets a guaranteed operational range guaranteeing operation of each of the at least one P-channel MOS transistor and the at least one N-channel MOS transistor.

5. A leak current detection circuit comprising:
a plurality of P-channel MOS transistors having different element characteristics, coupled to a high potential power supply, and including:
   a first transistor which has a first element characteristic and which is normally inactivated and generates a first leak current; and
   a second transistor which has a second element characteristic that differs from the first element characteristic and which is normally inactivated and generates a second leak current;
a plurality of N-channel MOS transistors having different element characteristics, coupled between a low potential power supply and the plurality of P-channel MOS transistors, and including:
   a third transistor which has the first element characteristic and which is normally inactivated and generates a third leak current; and
   a fourth transistor which has the second element characteristic and which is normally inactivated and generates a fourth leak current; and
a detector which detects a potential generated at the node between the plurality of P-channel MOS transistors and the plurality of N-channel MOS transistors in accordance with the first, second, third, and fourth leak currents.

6. A body bias control circuit coupled to a leak current detection circuit, wherein the leak current detection circuit includes a P-channel MOS transistor coupled to a high potential power supply, which is constantly inactivated during a test operation and generates a first leak current, an N-channel MOS transistor which is coupled between a low potential power supply and the P-channel MOS transistor and which is constantly inactivated during the test operation and generates a second leak current, and a detector which detects a potential indicating a difference between the first leak current and the second leak current at a node between the P-channel MOS transistor and the N-channel MOS transistor, with the P-channel MOS transistor having a first backgate which receives a first body bias, and the N-channel MOS transistor having a second backgate which receives a second body bias, the body bias control circuit comprising:
   a control circuit which generates a first control signal for controlling the first body bias and a second control signal for controlling the second body bias based on the potential detected by the detector and indicating the difference.

7. The body bias control circuit according to claim 6, wherein:
the detector compares the potential that is in accordance with the first leak current and the second leak current with a reference voltage and generates an output signal indicating the comparison result;
the control circuit generates a first control signal for controlling the first body bias and a second control signal for controlling the second body bias based on the output signal of the detector; and
the body bias control circuit further comprising:
a first body bias generation circuit which is coupled to the control circuit and the P-channel MOS transistor and which generates the first body bias in response to the first control signal from the control circuit; and
a second body bias generation circuit which is coupled to the control circuit and the N-channel MOS transistor and which generates the second body bias in response to the second control signal from the control circuit.

8. The body bias control circuit according to claim 7, wherein:
the P-channel MOS transistor has a first element characteristic, and the N-channel MOS transistor has a second element characteristic; and
the reference voltage is set to either one of a lower limit voltage value and an upper limit voltage value which sets a desired guaranteed operational range that determines the first element characteristic and the second element characteristic.

9. A semiconductor device comprising:
an internal circuit including a plurality of first P-channel MOS transistors, each having a first backgate, and a plurality of second N-channel MOS transistors, each having a second backgate;
a testing circuit which is coupled to the internal circuit and which supplies the first backgate and the second backgate with a first body bias and a second body bias, respectively, wherein the testing circuit including:
   a leak current detection circuit that includes a third P-channel MOS transistor which is coupled to a high potential power supply and which is normally inactivated and generates a first leak current, a fourth N-channel MOS transistor which is coupled between a low potential power supply and the third P-channel MOS transistor and which is normally inactivated and generates a second leak current, and a detector which detects a potential that is in accordance with the first leak current and the second leak current at a node between the third P-channel MOS transistor and the fourth N-channel MOS transistor; and
   a body bias control circuit which controls at least either one of the first body bias and the second body bias in accordance with the potential detected by the detector.

10. The semiconductor device according to claim 9, wherein:
the third P-channel MOS transistor has a third backgate which receives the first body bias, and the fourth P-channel MOS transistor has a fourth backgate which receives the second body bias;
the detector compares the potential that is in accordance with the first leak current and the second leak current with a reference voltage value and generates an output signal indicating the comparison result;
the body bias control circuit includes:
   a control circuit which generates, based on the output signal of the detector, a first control signal for controlling the first body bias and a second control signal for controlling the second body bias;
   a first body bias generation circuit which is coupled to the control circuit and the third P-channel MOS transistor and which generates the first body bias supplied to the third backgate in response to the first control signal from the control circuit; and
   a second body bias generation circuit which is coupled to the control circuit and the fourth N-channel MOS transistor and which generates the second body bias supplied to the fourth backgate in response to the second control signal from the control circuit.

11. The semiconductor device according to claim 10, wherein:
the third P-channel MOS transistor has a first element characteristic, and the fourth N-channel MOS transistor has a second element characteristic; and
the reference voltage is set to either one of a lower limit voltage value or an upper limit voltage value that sets a desired guaranteed operational range determining each of the first element characteristic and the second element characteristic.

12. The semiconductor device according to claim 11, wherein the lower limit voltage value and the upper limit voltage value are each set so that the difference between the first element characteristic and the second element characteristic is maximum in the guaranteed operational range.

13. The semiconductor device according to claim 12, wherein:
the reference voltage is set to one of the lower limit voltage value, the upper limit voltage value, and a first voltage value that is less than the lower limit voltage value;
the control circuit generates a third control signal for changing at least one of the first body bias and second body bias when the potential at the node is less than the first voltage value, and generates a fourth control signal for changing at least one of the first body bias and second body bias when the potential at the node is greater than the first voltage value and less than the lower limit voltage value.

14. The semiconductor device according to claim 13, wherein:
the reference voltage is set to one of the lower limit voltage value, the upper limit voltage value, the first voltage value, and a second voltage value that is greater than the upper limit voltage value;
the control circuit generates a fifth control signal for changing at least one of the first body bias and the second body bias when the potential at the node is greater than the upper limit voltage value and less than the second voltage value, and generates a sixth control signal for changing at least one of the first body bias and second body bias when the potential at the node is greater than the second voltage value.

15. The semiconductor device according to claim 11, wherein
the plurality of first P-channel MOS transistors each have the first element characteristic that is the same as the third P-channel MOS transistor;
the plurality of second N-channel MOS transistors each have the second element characteristic that is the same as the fourth N-channel MOS transistor.

16. A semiconductor device comprising:
an internal circuit including a plurality of first P-channel MOS transistors each having a first element characteristic and a first backgate, a plurality of second P-channel MOS transistors each having a second element characteristic and a second backgate, a plurality of third N-channel MOS transistors each having the first element characteristic and a third backgate, and a plurality of fourth N-channel MOS transistors each having the second element characteristic and a fourth backgate;
a testing circuit which is coupled to the internal circuit and which supplies a first body bias to the first and second backgates and supplies a second body bias to the third and fourth backgates, wherein the testing circuit including:
a leak current detection circuit which includes:
an n number of fifth P-channel MOS transistors having the first element characteristic which are coupled to a high potential power supply, normally inactivated, and generate a first leak current;
an n number of sixth P-channel MOS transistors having the second element characteristic which are coupled to the high potential power supply, normally inactivated, and generate a second leak current;
an n number of seventh N-channel MOS transistors having the first element characteristic which are coupled between a low potential power supply and the fifth and sixth P-channel MOS transistors, normally inactivated, and generate a third leak current;
an n number of eighth N-channel MOS transistors having the second element characteristic which are coupled between the low potential power supply and the fifth and sixth P-channel MOS transistors, normally inactivated, and generating a fourth leak current; and
a detector which detects the potential corresponding to the first through fourth leak currents at a node between the fifth and sixth P-channel MOS transistors and the seventh and eighth N-channel MOS transistors; and
a body bias control circuit which controls at least either one of the first body bias and the second body bias in accordance with the potential detected by the detector.

17. The semiconductor device according to claim 16, wherein:
the quantity of the n number of fifth P-channel MOS transistors that are used and the quantity of the n number of sixth P-channel MOS transistors that are used are set in accordance with the ratio of the used plurality of first P-channel MOS transistors and plurality of second P-channel MOS transistors; and
the quantity of the n number of seventh N-channel MOS transistors that are used and the quantity of the n number of eighth N-channel MOS transistors that are used are set in accordance with the ratio of the used plurality of third N-channel MOS transistors and plurality of fourth N-channel MOS transistors.

18. A method for testing a semiconductor device, in which the semiconductor device is provided with an internal circuit including a plurality of first P-channel MOS transistors each having a first backgate and a plurality of second N-channel MOS transistors each having a second backgate, and a testing circuit which tests operation of the internal circuit by supplying the first backgate and the second backgate respectively with a first body bias and a second body bias, with the testing circuit including a third P-channel MOS transistor which is coupled to a high potential power supply and which is normally inactivated and generates a first leak current and a fourth N-channel MOS transistor which is coupled between a low potential power supply and the third P-channel MOS transistor and which is normally inactivated and generates a second leak current, the method comprising:
detecting a potential that is in accordance with the first and second leak currents at a node between the third P-channel MOS transistor and the fourth N-channel MOS transistor; and
changing at least either one of the first body bias and the second body bias in accordance with the detected potential.

19. The method according to claim 18, further comprising:
re-detecting the potential at the node after changing at least either one of the first body bias and the second body bias.

* * * * *